United States Patent
Laufenberg et al.

(10) Patent No.: US 9,812,632 B2
(45) Date of Patent: Nov. 7, 2017

(54) ACTUATOR DEVICE

(71) Applicant: ETO MAGNETIC GMBH, Stockach (DE)

(72) Inventors: Markus Laufenberg, Stockach (DE); Thomas Schiepp, Seitingen-Oberflacht (DE)

(73) Assignee: ETO Magnetic GmbH, Stockach (DE)

( * ) Notice: Subject to any disclaimer, the term of this patent is extended or adjusted under 35 U.S.C. 154(b) by 286 days.

(21) Appl. No.: 14/418,947

(22) PCT Filed: May 31, 2013

(86) PCT No.: PCT/EP2013/061307
§ 371 (c)(1),
(2) Date: Feb. 1, 2015

(87) PCT Pub. No.: WO2014/019738
PCT Pub. Date: Feb. 6, 2014

(65) Prior Publication Data
US 2015/0207059 A1    Jul. 23, 2015

(30) Foreign Application Priority Data
Aug. 1, 2012 (DE) .......... 10 2012 107 014

(51) Int. Cl.
*H01L 41/12* (2006.01)
*H01L 41/06* (2006.01)
*H02N 2/04* (2006.01)

(52) U.S. Cl.
CPC .......... *H01L 41/12* (2013.01); *H01L 41/06* (2013.01); *H02N 2/04* (2013.01)

(58) Field of Classification Search
CPC .......... H01L 41/12; H01L 41/06; H02N 2/04
(Continued)

(56) References Cited

U.S. PATENT DOCUMENTS 4,585,978 A * 4/1986 Hasselmark ............ H01L 41/12
310/26
8,237,525 B2   8/2012 Hoang et al.
(Continued)

FOREIGN PATENT DOCUMENTS

CN        100388611 C    5/2008
CN        201234215 Y    5/2009
(Continued)

OTHER PUBLICATIONS

William Francis Magie's book of "Principles of Physics", p. 400, 1911.*

*Primary Examiner* — Terrance Kenerly
(74) *Attorney, Agent, or Firm* — Bachman & LaPointe, PC

(57) ABSTRACT

An actuator device having an expansion unit (10), which comprises a magnetically active shape memory alloy material (12) and which carries out an expansion movement from a starting position along an expansion direction as a reaction to an energization of a coil device (30) and interacts with restoring means which exert on the expansion unit (10) a restoring force opposite to the expansion direction, wherein the restoring force has permanent magnets which act or are seated on a section of the expansion unit (10) such that the restoring force generated magnetically by the permanent magnets changes with increasing expansion stroke in the expansion direction, wherein the permanent magnets (16, 34, 40, 52, 54) are embodied and/or designed such that the expansion unit (10) can contract into the starting position along the expansion stroke when the coil device (30) is not energized.

12 Claims, 4 Drawing Sheets

(58) Field of Classification Search
USPC .......................................................... 310/26
See application file for complete search history.

(56) References Cited

U.S. PATENT DOCUMENTS

| | | | |
|---|---|---|---|
| 2005/0200207 A1* | 9/2005 | Hasegawa | H02K 33/16 310/10 |
| 2005/0212364 A1* | 9/2005 | Ohashi | H01L 41/12 310/26 |
| 2006/0144472 A1* | 7/2006 | Ullakko | B06B 1/045 148/104 |
| 2010/0242673 A1* | 9/2010 | Laufenberg | F02D 9/1065 74/99 R |
| 2013/0038414 A1 | 2/2013 | Laufenberg et al. | |

FOREIGN PATENT DOCUMENTS

| | | |
|---|---|---|
| DE | 102004060532 A1 | 6/2006 |
| DE | 102005038891 A1 | 2/2007 |
| DE | 102011052528 B3 | 2/2013 |

* cited by examiner

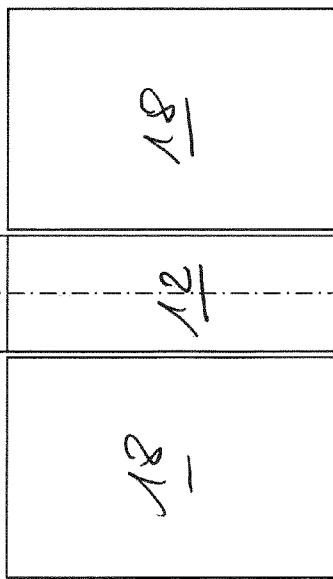
14
18
12
18
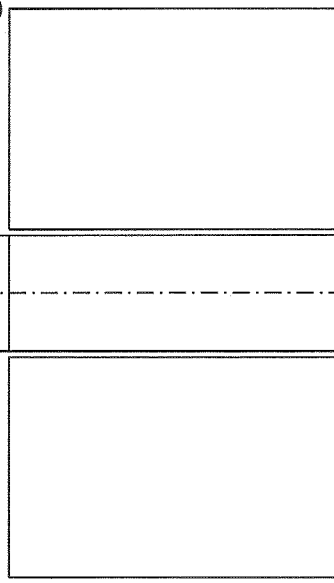
Fig. 10  Fig. 12
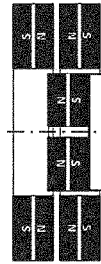
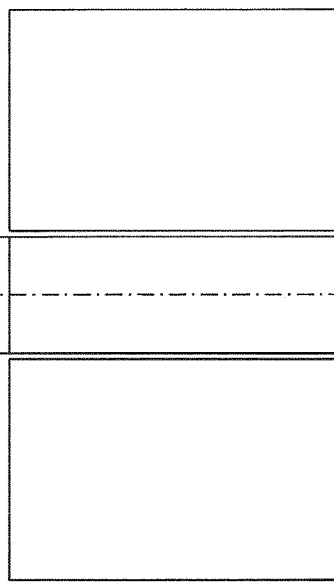
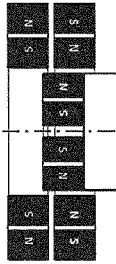
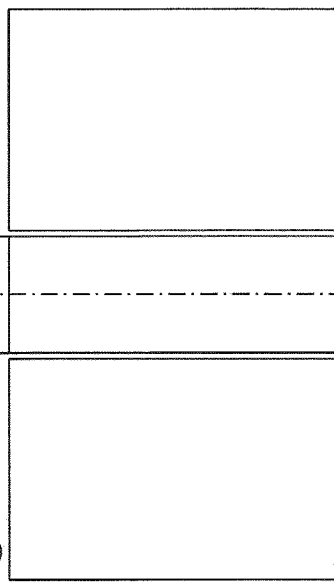
Fig. 11  Fig. 13

ACTUATOR DEVICE

BACKGROUND OF THE INVENTION

The present invention relates to an actuator of the type known from DE 10 2005 038 891 A1 and also from DE 10 2011 052 528, which was not previously published.

It is known from this prior art (as well as from the fundamental general technology, which is assumed to be known) to use magnetically active shape memory alloy materials (MSM materials=Magnetic Shape Memory, equivalent here to SMA: Shape Memory Alloy) for the actuator system. For this purpose, for instance, a magnetic field generated by an energised coil is applied to an MSM (SMA) crystal body (as a representative for a multiplicity of possible MSM-based materials), produced for instance on the basis of an NiMnGa alloy. As a reaction to exposure to a magnetic field in this manner, the MSM crystal body executes an expansion movement in a direction perpendicular to the magnetomotive force direction with the electromagnetically generated field. This expansion movement can then, at a driven end, drive an actuation partner that interacts with said end.

Such magnetically active shape memory alloy materials and actuators (actuator devices) implemented in the basic manner described thus offer a possibility of replacing or supplementing customary magnet-based actuator principles (such as electromagnetic actuators). The advantage of the magnetic shape memory alloy material used, in addition to simplicity of mechanical design in implementation (no armature moves as a whole; only an expansion of the expansion unit takes place), is most of all a potentially fast reaction time of the expansion to the application of the magnetic field (at the necessary level).

However, MSM-based actuator devices, which are assumed to be known, also have disadvantages (owing to the basic principle and design) compared to other actuator principles, as a result of which actually universal usability has been limited in practice. For instance, a usable travel of the expansion movement (i.e. an extent of an extension movement executed by the MSM crystal) is typically limited to approx. 3% to 6% of a corresponding axial extent of the crystal, so straight, large-travel movements can be implemented only with difficulty by means of SMA/MSM actuators.

Furthermore, known MSM (SMA) actuators have the property of the intended expansion movement taking place as a reaction to an applied magnetic field (of a necessary minimum field strength). After a drop in the magnetic field (below the minimum threshold), there is however no automatic compression back to the originally compressed state (the starting position). Rather, the crystal consisting of the SMA material remains in the expanded position even after the drop below an expansion threshold or the complete deactivation of the magnetic field. With devices known from the prior art, such as DE 10 2005 038 891 A1, which is cited as the generic type, resetting (i.e. returning the expansion to the non-expanded starting position) is therefore implemented with restoring means, which are formed in said document as a mechanical spring. Such a spring exerts its spring force counter to the expansion direction. If the spring force of such a known restoring spring in relation to an (unloaded) expansion force of the SMA crystal is set up in such a manner that the SMA material overcomes the counter force (restoring force) of the spring on exposure to the magnetic field, the intended expansion movement takes place. When the magnetic field drops (below the necessary minimum field strength) after the end of energisation, the spring force (restoring force) acting on the MSM crystal then results in contraction back to the starting position.

A suitable combination of the SMA (MSM) crystal characterising the expansion unit as the SMA material in interaction with the suitably dimensioned restoring spring thus achieves a desired actuation and restoring behaviour, so numerous actuation tasks can be carried out with technology of this type.

However, the use of a spring (for instance a helical spring, as disclosed in DE 10 2005 038 891 A1) has the disadvantage of a typically linearly ascending characteristic in the force-path graph, that is, in the increasingly expanded state of the expansion unit (that is, with increasing expansion travel), the restoring spring force acting on the expansion unit increases. This property is disadvantageous precisely with regard to a desirable actuation force of a generic actuator device, said force being constant over the entire actuation travel (expansion travel), since it regularly results in the actuation force dropping considerably shortly before the end of the effective travel maximum, and therefore some actuation tasks cannot be implemented reliably. The work (as a difference between MSM actuation force and spring restoring force over the effective travel range) that can be realised by such a device (i.e. combination of SMA-based expansion unit with restoring spring) is also limited correspondingly thereby.

DE 10 2011 052 528 of the applicant already notes this fundamental disadvantage of the technology forming the generic type and achieves the resulting object of equalising the (resulting) actuation force over the entire expansion travel by using as the restoring means a spring combination or spring configuration, the restoring force behaviour of which does not ascend linearly over the expansion profile but drops or has a flat profile, at least in some sections. As a result, the actuation force acting on a downstream actuation partner also increases in expanded travel sections.

However, this procedure is also mechanically complex, demands careful setup of the spring units to be provided in this case as restoring means and in this respect has potential for further improvements.

It is therefore the object of the present invention to improve a generic actuator device with regard to the (actuation) force behaviour thereof along the entire movement travel and at the same time to ensure reliable restoration by the restoring means. In particular, an alternative to the restoring springs, which are assumed to be known, must be provided with regard to the restoring means according to the invention.

SUMMARY OF THE INVENTION

The object is achieved by the actuator device of the invention.

In an advantageous manner according to the invention, permanent magnet means are provided instead of the springs (in a preferred development of the invention, the restoring means do not contain any springs or no springs act with a restoring force on the expansion unit), which permanent magnet means engage or rest on a section of the expansion unit in such a manner that a restoring force generated by permanent magnets acts on the expansion unit, which force can bring the expansion unit from an expanded state back to the compressed starting position. The permanent magnet means are provided (and either provided directly on an (end) section of the expansion unit and/or attached to a non-movable stator section of the actuator device) in such a manner that said permanent-magnetic restoring force, which acts on the expansion unit counter to the expansion direction, varies depending on a current expansion (a current expansion travel).

In a particularly preferred form, the permanent magnet means are set up or provided and formed in such a manner that the restoring force that is generated by permanent magnets falls with increasing expansion (i.e. increasing expansion travel in the expansion direction), with the result that the resulting force of the actuator device (i.e. expansion force effective from the expansion of the SMA material minus restoring force) does not fall, but rather can remain constant or even increase with increasing expansion, in contrast to a known spring characteristic assumed to form the generic type. This advantageously makes it possible according to the invention for a virtually constant (where appropriate even increasing) resulting application of force to the actuation partner to be actuated with the actuator according to the invention to take place, so completely new possibilities are opened up compared to a generic, spring-based solution.

It is particularly preferred and favourable in the context of preferred developments of the invention to set up and provide the SMA (MSM) material used according to the invention for expansion in such a manner that the electromagnetic flux generated by the energisation of the coil device flows transversely through said shape memory allow material, i.e. in a direction perpendicular to the expansion or movement direction. This advantageously takes place according to the invention in that suitable flux-conducting means, for instance in the form of suitably flux-conductive sections, are formed laterally adjacent to the SMA material (SMA crystal), which flux-conducting means at the same time function as a stator of the actuator device. It is particularly favourable for instance in the context of a radially symmetrical device for such a stator to be formed on the outer side of a central SMA (MSM) crystal that further preferably extends in the expansion direction.

If, according to a further preferred embodiment, a permanent magnet element (permanent magnet body) is provided at the end of such an elongate MSM crystal (with an interposed magnet-free section), said stator can act as a flux conductor for the permanent magnetic field in its section adjacent to the permanent magnet body and in this respect (forming an air gap) close the permanent-magnetic flux circuit. If the electromagnetically generated flux is then conducted through the SMA crystal when the coil device is energised, the expansion of the expansion device takes place, and thus also the movement of the permanent magnet resting on the end along the travel direction out of the starting position, with the effect that the air gap to the stator grows. The result is a weakening in the permanent-magnetic attraction force (and correspondingly in the restoring force on the expansion unit) and the achievement of an essential objective of the present invention, namely the effect that although in this expanded position a permanent-magnetic restoring force still acts counter to the expansion direction for compression when the energisation is deactivated, this permanent-magnetic restoring force in the extended position is much smaller compared to the original, compressed position. The resulting actuation force of the actuator device in the direction of the expanded state is correspondingly increased.

In further configurations of the invention according to preferred developments, it is then preferred in particular to configure the permanent-magnetic flux circuit or its modification (more precisely: modification of an air gap) by means of the travel movement. Further preferred exemplary embodiments favourably provide for instance for cup-, arc- or yoke-shaped flux-conducting means to be assigned to the permanent magnet means provided on the end of the expansion unit, additionally or alternatively for the permanent magnet means themselves to be configured flux-conductively (in a manner suitable for restoring) in this manner and/or for suitably formed permanent magnet means to be embedded flux-conductively in such a flux-conducting structure.

On the one hand, it is preferred, for instance if cylindrical permanent magnet bodies are used, for these to be magnetised axially ("axially" meaning in the context of the present invention the travel or expansion direction); additionally or alternatively, for instance if suitably disc-shaped permanent magnet bodies are used, a radial magnetisation could prove sensible and advantageous.

In particular in the case of a variant within the context of the present invention in which permanent magnet means are provided both on the armature side (i.e. connected to the expansion unit and moved by same) and on the stator side (i.e. are not moved by the expansion) and are configured to interact with each other, extremely effective effects and configurations of the resulting restoring force profile (and thus of the overall force profile) can be achieved: By for instance directing permanent magnet poles of the same polarity towards each other on both the armature side and the stator side, a repulsion effect achieved thereby (in interaction between the permanent magnet units) can be used to achieve a suitable force behaviour or an influence on the restoring force along the travel along the travel direction (expansion direction). In the context of preferred developments of the invention, individual permanent magnet bodies can also be formed from a plurality of suitably coated permanent magnet bodies, which are where necessary also formed and fastened with their poles counter to each other, as the permanent magnet means according to the invention. Again additionally or alternatively, it is provided according to a development for suitable cones to be formed on the stator or armature side, which cones influence suitable permanent-magnetic fluxes in their flux-conducting behaviour (in relation to an intermediate air gap) and in this manner also provide the possibility of setting or designing a desired force profile.

Although typical and preferred applications for the present technology lie for instance in the field of automotive and drive technology (for instance for operating valves, for adjusting motor assemblies or the like), the present invention is not limited to such typical applications. Rather, the present invention is suitable for any application in which the advantages of a force profile that can be suitably configured and potentially not limited or reduced by a mechanical spring in the travel end range can be used to realise a respective actuation task in a reliable, operationally safe manner that is simple to produce.

BRIEF DESCRIPTION OF THE DRAWINGS

Further advantages, features and details of the invention result from the following description of preferred exemplary embodiments, as well as on the basis of the drawings. In the figures

FIGS. 10-13: show further embodiments of the present invention with both permanent magnet bodies on the stator side and permanent magnet bodies provided on the expansion unit.

DETAILED DESCRIPTION

In the exemplary embodiments described below, the same or equivalent functional components are provided with the same reference symbols.

Figure 1:
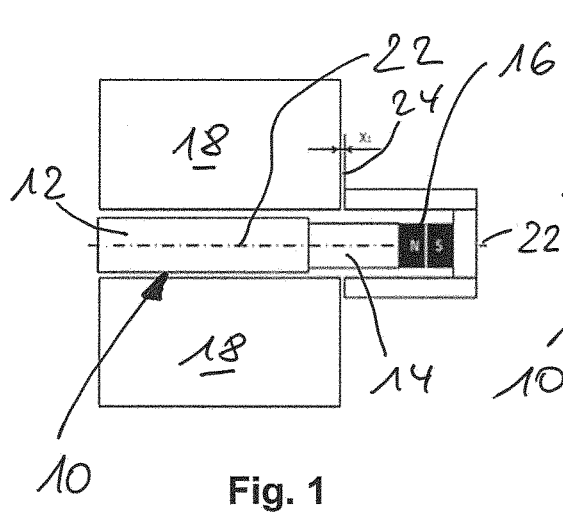
FIGS. 1, 2: show a first embodiment of the present invention in the starting position (FIG. 1) and in the expanded state (FIG. 2)

FIG. 1 shows a fragmented illustration (without showing a coil device for generating the electromagnetic field) of a first embodiment of the present invention.

An expansion unit 10 consisting of an elongate shape memory alloy crystal 12, a magnetically non-conductive section 14 adjoining thereto, and an axially magnetised permanent magnet body 16 is guided in the manner of a tappet inside a flux-conductive stator 18. Said flux-conductive stator conducts an electromagnetic flux of the coil means (not shown) in a transverse direction along an arrow direction 20 through the MSM crystal 12, to effect an expansion movement in the axial direction, corresponding to the axis 22 shown.

Figure 2:
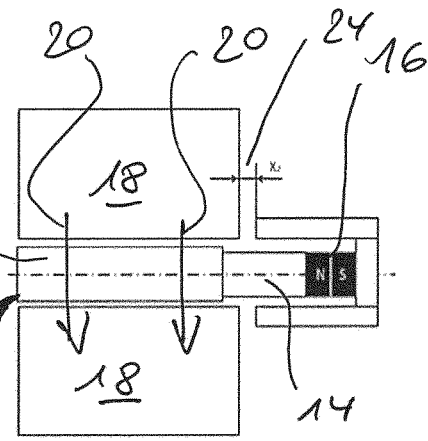

As can also be seen in FIGS. 1, 2, the permanent magnet body 16 is assigned a cup-shaped flux-conducting element 24, which closes a permanent-magnetic flux circuit via the stator 18, forming an air gap 24 (distance x1 in the starting position of FIG. 1).

In contrast to the non-energised coil state of FIG. 1, FIG. 2 shows the energised state (flux arrows 20 through the MSM crystal 12). Said crystal expands along the expansion direction (to the right in the figure plane), with the result that the air gap 24 of the permanent-magnetic flux circuit widens to the distance x2. The permanent-magnetic attraction force of the flux-conducting body 24 in the direction of the stator 18 is correspondingly weaker, in this respect corresponding to a weaker restoring force acting counter to the expansion direction. The device is at the same time configured in such a manner that the permanent magnet flux is great enough when the coil device is deactivated, even in the still expanded state of FIG. 2, to exert the restoring force on the SMA material of the crystal 12 analogously to the behaviour of a restoring spring and correspondingly to bring the expansion 10 back to the starting state (starting position) of FIG. 1.

Figure 3:
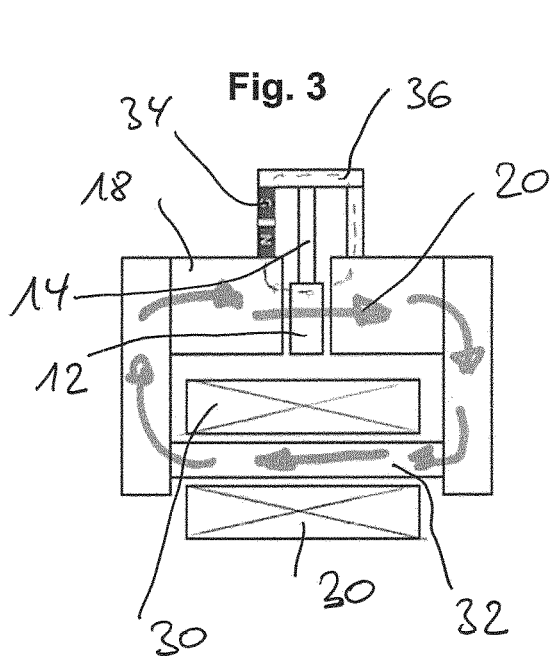
FIGS. 3, 4: show a second embodiment of the present invention with a variant of the configuration of the permanent magnet means compared to the first embodiment, again in the starting position (FIG. 3) and expanded (FIG. 4)
Figure 4:
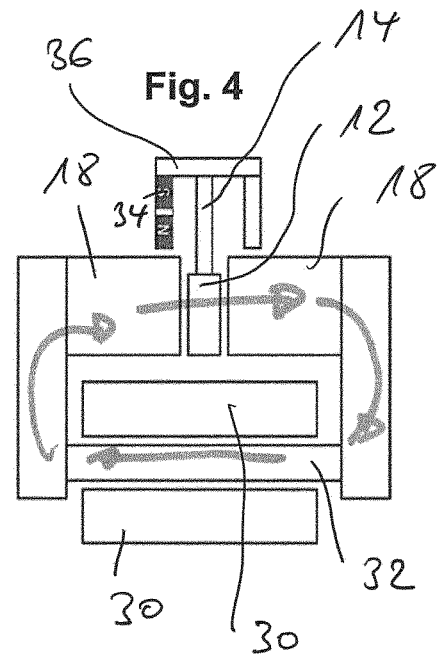

FIGS. 3 and 4 show a second embodiment of the present invention, in a somewhat more detailed configuration and with additionally shown coil unit 30, which is provided around a flux-conductive section 32 and introduces the transversely running electromagnetic flux 20 into the flux-conducting elements (stator) 18 in the manner shown. In the exemplary embodiment of FIGS. 3, 4, in variance from the first exemplary embodiment, the flux-conducting element 36 assigned to the permanent magnet body 34 (again axially magnetised) is configured in such a manner that the permanent magnet body 34 is partially accommodated in the lateral face thereof.

The arrows drawn schematically in the illustration of FIGS. 3, 4 also show that the flux-conducting section 32 closes the permanent-magnetic flux circuit.

Figure 5:
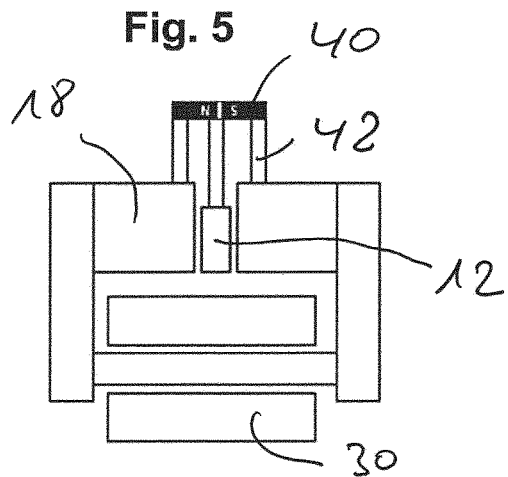
FIGS. 5-9: show further variants of the present principle according to the invention as further embodiments with different configurations of the permanent magnet means on the expansion unit (FIG. 5, FIG. 6) and on the stator side (FIG. 7-9)
Figure 6:
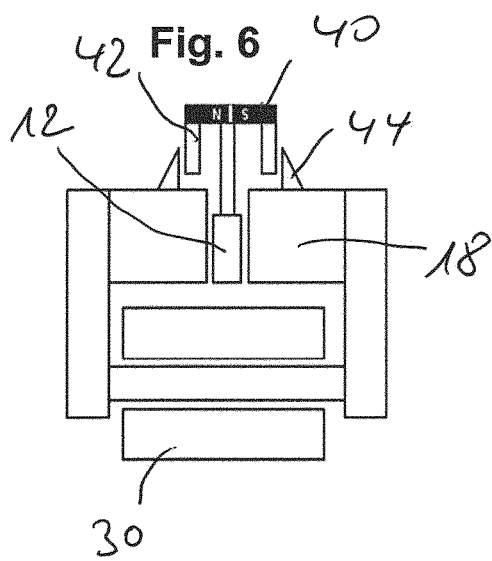

FIGS. 5 and 6 show further variants of a permanent magnet unit on the armature side (i.e. provided on the expansion unit itself and movable with same), in FIGS. 5, 6 in the form of a disc-shaped or rod-shaped permanent magnet body 40, which is formed at the end of an associated flux-conducting unit 42. As an additional variant, the stator 18 in the exemplary embodiment of FIG. 6 contains a cone section 44, which determines by means of its configuration the flux transfer in the air gap to the armature depending on the travel.

Figure 7:
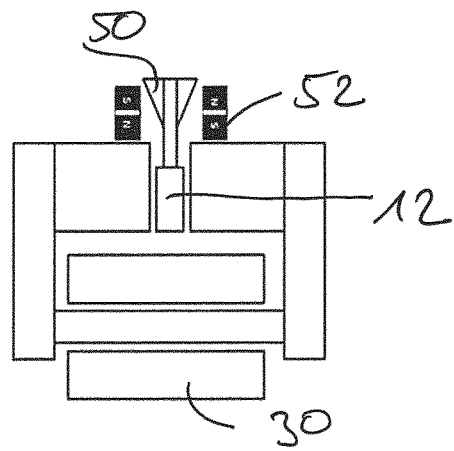
Figure 8:
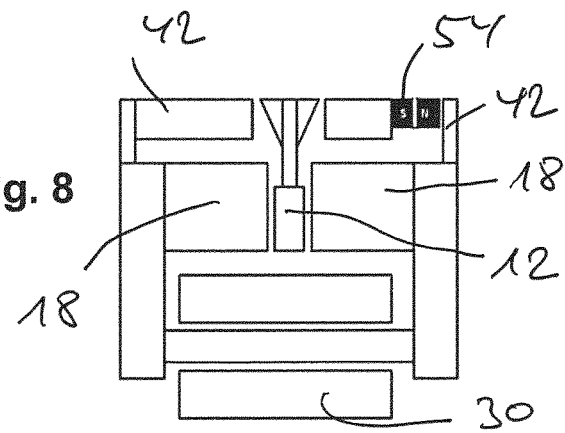
Figure 9:
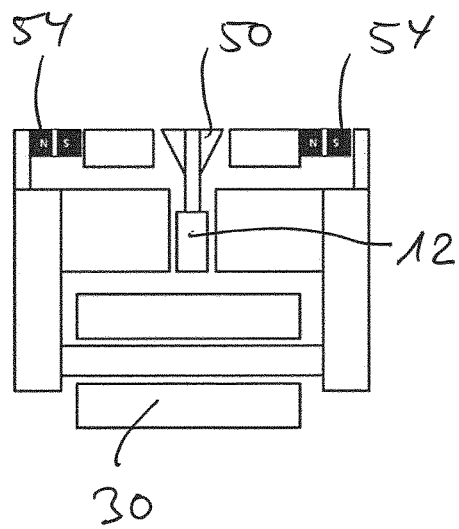

In contrast, the exemplary embodiments of FIGS. 7 to 9 show an expansion unit that has a flux-conducting unit 50 (again preferably cone-shaped) at the end for interaction with permanent magnet means on the stator side, but itself does not provide any permanent magnets on the expansion unit. In this respect the exemplary embodiments of FIGS. 7 to 9 with the respective variants of permanent magnet bodies 52 on the stator side (as axially magnetised permanent magnets in FIG. 7 or as rod magnets 54 in the variants of FIGS. 8, 9) are reversals of the principle provided with a cone on the stator side of FIG. 6. The suitable assignment of the respective arrangement and configuration of the permanent magnets and integration into a permanent magnet flux to a respective actuation purpose and to a desired force action again depends on a respective application and a concrete configuration.

In principle, the movement and force behaviour corresponds to the first exemplary embodiment of FIGS. 1, 2.

FIGS. 10 to 13 show variants of the invention as further exemplary embodiments, in which permanent magnet arrangements are provided both on the expansion unit and on the stator side, suitable in the form of disc- or ring-shaped permanent magnet bodies, which are provided individually or in groups. Corresponding to their interaction with the expansion unit, an attraction or repulsion effect is utilised, the exemplary embodiment of FIG. 10 showing, for instance, how first attraction effects, then repulsion effects act with equal polarity along the movement travel (in the vertical direction in the figure) between the expansion unit and the surrounding stator side. In this case too, merely basic diagrams are shown, which can be configured as desired for a respective application.

Figure 14:
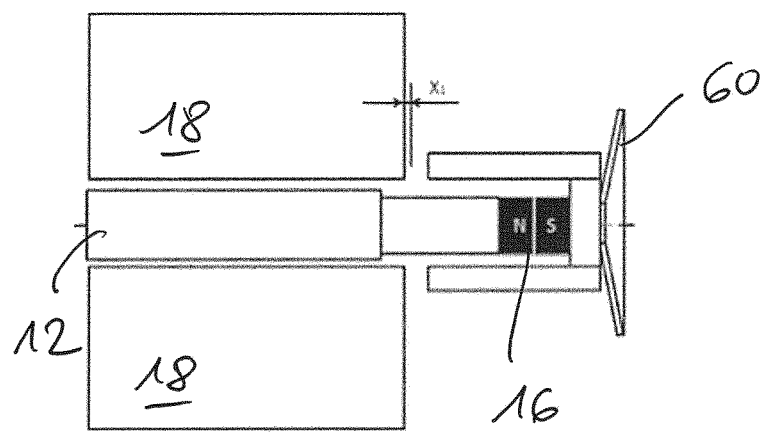
FIGS. 14, 15: show a further embodiment of the invention as a development of the first embodiment of FIGS. 1, 2 with mechanical springs additionally assigned in a restoring manner to the expansion unit, which springs exert restoring forces on the expansion unit in the same direction as the permanent-magnetic restoring force.
Figure 15:
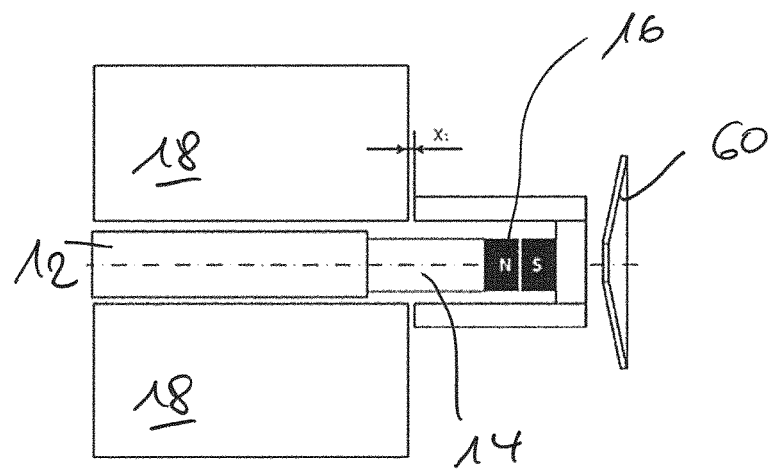

FIGS. 14 and 15 show as a further embodiment how a mechanical spring (in this case shown as a plate spring 60) can be assigned to the expansion unit for the purpose of an additional increase in the restoring force at the end. The juxtaposition of FIG. 15 (expanded state and action of the spring) and FIG. 16 (contracted state without mechanical spring contact) illustrates that in this case too an additional influence on the force behaviour is possible depending on the expansion path.

The present invention is not limited to the exemplary embodiments shown, but rather is offered in any desired combinations for configuring a desired force behaviour along a travel path.

The invention claimed is:

1. An actuator device comprising an expansion unit containing a magnetically active shape memory alloy material, said expansion unit executes an expansion movement from a starting position along an expansion direction as a reaction to energisation of a coil device and interacting with restoring means for exerting a restoring force counter to the expansion direction on the expansion unit, the restoring means comprises permanent magnet means for acting on a section of the expansion unit in such a manner that a restoring force generated by permanent magnets changes with increasing expansion travel in the expansion direction, wherein the permanent magnet means are formed and/or set up in such a manner that a contraction of the expansion unit into the starting position can take place along the expansion travel when the coil device is not energised.

2. The device according to claim 1, wherein the permanent magnet means generates the restoring force that is generated by permanent magnets such that the restoring force falls or is reduced with increasing expansion travel.

3. The device according to claim 1, wherein the shape memory alloy material is elongated along the expansion direction and has assigned flux-conducting means on a lateral and/or surface side, which flux-conducting means effect a magnetic flux through the shape memory alloy material owing to the energisation in a flux direction transverse to the expansion direction.

4. The device according to claim 3, wherein the flux-conducting means interact with the permanent magnet means in such a manner that a permanent magnet flux of the permanent magnet means flows through at least some sections of the flux-conducting means during energisation and when the coil device is not energised.

5. The device according to claim 1, wherein the elongate expansion unit has the permanent magnet means on an end section that is moved by the expansion.

6. The device according to claim 5, wherein the permanent magnet means are assigned a permanent magnet flux-conducting means for conducting a permanent magnet flux to a stationary core unit assigned to the shape memory alloy material.

7. The device according to claim 6, wherein the permanent magnet flux-conducting means is one of cup-, arc- or yoke-shaped.

8. The device according to claim 5, wherein the permanent magnet means have an axially magnetised permanent magnet body in relation to the expansion direction.

9. The device according to claim 5, wherein the permanent magnet means have a disc-shaped and radially magnetised permanent magnet body.

10. The device according to claim 1, wherein a first permanent magnet body of the permanent magnet means is provided at the end of the expansion unit and for magnetic interaction with a second permanent magnet body of the permanent magnet means, the second permanent magnet body is provided on a stator section laterally adjacent to the first permanent magnet body.

11. The device according to claim 10, wherein the first and second permanent magnet bodies comprise radially magnetised permanent magnet bodies relative to the expansion direction, having the same poles directed towards each other.

12. The device according to claim 1, wherein the permanent magnet means are assigned a cone section which conducts the permanent magnet flux and extends along the expansion direction.

* * * * *